United States Patent
Rademacher

(10) Patent No.: US 7,221,203 B2
(45) Date of Patent: May 22, 2007

(54) PULSE-WIDTH MODULATOR CIRCUIT AND METHOD FOR CONTROLLING A PULSE WIDTH MODULATOR CIRCUIT

(75) Inventor: Markus Rademacher, Augsburg (DE)

(73) Assignee: Minebea Co., Ltd., Miyota-Machi, Kitasaku-Nagano-Ken (JP)

( * ) Notice: Subject to any disclaimer, the term of this patent is extended or adjusted under 35 U.S.C. 154(b) by 0 days.

(21) Appl. No.: 10/532,821

(22) PCT Filed: Jan. 8, 2004

(86) PCT No.: PCT/EP2004/000080

§ 371 (c)(1),
(2), (4) Date: Nov. 8, 2005

(87) PCT Pub. No.: WO2004/065198

PCT Pub. Date: Aug. 5, 2004

(65) Prior Publication Data

US 2006/0152263 A1    Jul. 13, 2006

(30) Foreign Application Priority Data

Jan. 22, 2003 (DE) ................................ 103 02 379

(51) Int. Cl.
*H03K 3/017* (2006.01)

(52) U.S. Cl. ...................................... 327/172; 327/175

(58) Field of Classification Search ........ 327/170–175, 327/361, 540, 541; 375/238
See application file for complete search history.

(56) References Cited

U.S. PATENT DOCUMENTS

| | | | |
|---|---|---|---|
| 5,146,601 A | 9/1992 | Hosaka et al. | 713/501 |
| 5,272,614 A | 12/1993 | Brunk et al. | 383/21.05 |
| 6,005,377 A * | 12/1999 | Chen et al. | 323/283 |
| 2006/0212679 A1* | 9/2006 | Alfano et al. | 712/38 |

FOREIGN PATENT DOCUMENTS

| | | |
|---|---|---|
| DE | 19734248 | 2/1999 |
| JP | 2002017089 | 1/2002 |
| WO | WO98/44622 | 10/1998 |

\* cited by examiner

*Primary Examiner*—Linh My Nguyen
(74) *Attorney, Agent, or Firm*—Duane Morris LLP

(57) ABSTRACT

The invention relates to a pulse width modulator circuit for generating a reference signal having a desired duty cycle comprising an adjustment unit including at least one storage register and a counter, the storage register being configured for storing values corresponding to the desired duty cycle at least approximately and which are set during a working cycle in the pulse width modulator circuit for generating a reference signal, and the counter setting a cycle count Y indicating how often a stored first value X is read during the working cycle A from the storage register, the value stored in the storage register being variable during the working cycle.

13 Claims, 2 Drawing Sheets

PULSE-WIDTH MODULATOR CIRCUIT AND METHOD FOR CONTROLLING A PULSE WIDTH MODULATOR CIRCUIT

The invention relates to a pulse width modulator circuit for generating a reference signal having a desired duty cycle, it also relating to a method for driving a pulse width modulator circuit in which the pulse width control signal is generated with a desired duty cycle.

The invention is applicable, for example, in the field of power supplies for driving a switched power supply, or for closed loop control of the output current of a switched power supply as a function of a desired value in which the output current of the switched power supply is measured and depending on the measured output current and a desired value a reference or control signal is set in a pulse width modulator serving to drive the switching means in the switched power supply.

Figure 1:
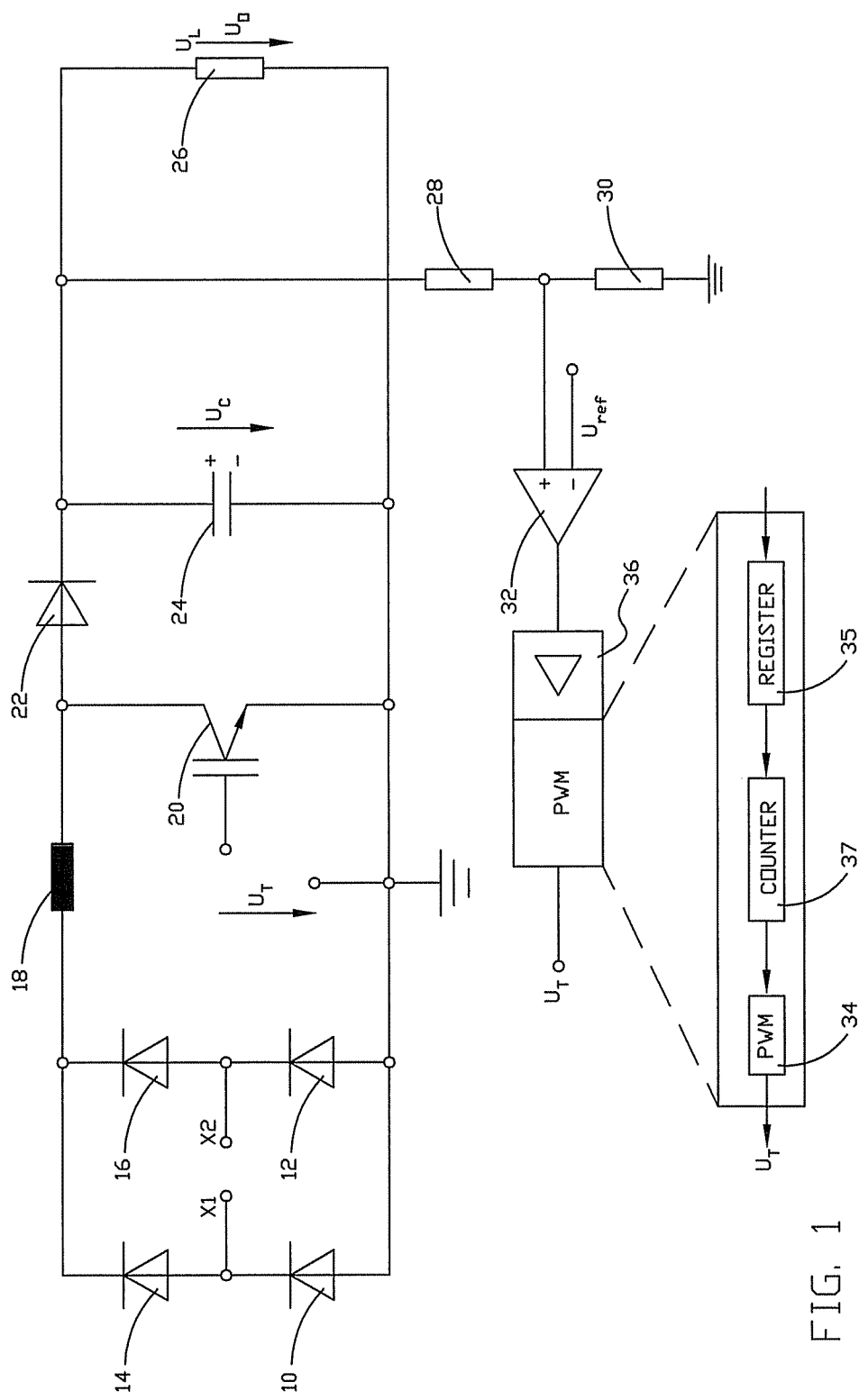

A prior art example of one such closed loop controlled switched power supply is shown in FIG. 1.

The power supply shown in FIG. 1 basically comprises an input rectifier, a power switch and an output filter, the rectifier more particularly comprising four rectifier diodes 10, 12, 14, 16 arranged in the form of a bridge circuit. The rectified output voltage of the bridge circuit is supplied via a storage and smoothing choke 18 carrying current in one way only, to a controllable electronic switch 20 connected via the output of the bridge rectifier. The electronic switch 20 may be a MOS-FET or an IGBT or some other such transistor switch. The transistor switch 20 is assigned an output/freewheel diode 22 which rectifies the chopper output voltage of the transistor switch 20. Connected to the output of the switched power supply is a unpopular storage capacitor 24 for storing and smoothing the output voltage. Connected to the output is a load resistor 26 across which an output voltage $U_0$ is generated.

In the example as shown, for the closed loop control, the output voltage $U_0$ is applied via a voltage divider 28, 30 and a P element formed by an operational amplifier 32 to a pulse width modulator module 34. The voltage divider 28, 30 is dimensioned so that when the desired output voltage $U_0$ appears at the junction between the resistances 28 and 30 a voltage is generated substantially the same as the reference voltage $U_{REF}$ at the input of the P element 32. The P element 32 thus generates a P element control voltage which is applied to the pulse width modulator module 34 for driving the switched power supply so that the desired output voltage is obtained. As illustrated in FIG. 1 the pulse width modulator module 34 is represented together with an input amplifier stage 36, it further comprises at least one storage register 35 and a counter 37 forming an adjustment unit for setting the pulse width modulator.

Generated at the output of the pulse width modulator module 34 is a control signal $U_T$ which is applied to the transistor switch 20.

It is understood that the invention is not restricted to the application of a pulse width modulator circuit as described. Instead, it may find application in any situation where a reference signal is needed in a closed loop or where a pulse width modulator is employed in general for generating a control signal or some other output signal.

In practical application of the pulse width modulators there is the problem of them working with a fixed, defined resolution. The output signal of the pulse width modulator may be set, for example, via a storage register, the width of which is dictated practically by the register width of a microcontroller. In prior art such a register width is, for example, 8, 10, 11 or 12 bits. This resolution as dictated by the fixed register width may be insufficient in certain applications. When, for example, a pulse width modulator having a register width of 10 bits is employed in a power supply capable of generating an output current in the range 0 to 50 Amps, a change of 1 bit in the storage register results in a jump in current of approximately 50 mA which may be too high in some cases. Since the register width is dictated by the microcontroller the resolution of the pulse width modulator cannot be enhanced directly.

It is thus the objective of the invention to define a pulse width modulator circuit and a method for driving a pulse width modulator circuit which now makes it possible to enhance the resolution of a pulse width modulator circuit in more particularly generating a reference signal which can be set with a higher resolution.

This objective is achieved by a pulse width modulator circuit as set forth in claim 1 and by a method as set forth in claim 6.

The pulse width modulator circuit in accordance with the invention serves to generate a reference signal featuring a desired duty cycle. For this purpose an adjustment unit is provided, comprising at least one storage register and a counter. The storage register may be a storage register as usual in a microcontroller, it serving to store the values corresponding at least approximately to the desired duty cycle and which can be set during the working cycle in the pulse width modulator circuit for generating the reference signal. In accordance with the invention a cycle count is set in the counter which indicates how often a stored first value is read during the working cycle from the storage register for setting the duty cycle of the pulse width modulator circuit. The value stored in the storage register can be varied during the working cycle so that the duty cycle during the working cycle can be set to a second value on timeout of the cycle count as set in the counter. Setting the duty cycle of the pulse width modulator circuit to a first value and to a second value during the working cycle now makes it possible to set the duty cycle of the pulse width modulator circuit in total to a weighted average between the first and the second value in thus achieving, or optimally approaching, a desired duty cycle.

In accordance with the invention an adder may be more particularly provided which receives the stored first value from the storage register and changes it when the cycle count is attained in generating a second value which is set during the remainder of the working cycle when the cycle count is attained. As an alternative, the first value stored in the storage register may be varied or externally defined in some other way when the cycle count is attained to store a second value which is set during the remainder of the working cycle when the cycle count is attained.

In one aspect of the invention the storage register has an 8 bit capacity and the counter a 3 bit capacity. The person skilled in the art will readily appreciate that this merely serves as an example and that both the storage register and the counter may have a capacity for more or fewer bits.

The invention also provides for a power supply including switching means and a pulse width modulator circuit of the aforementioned type, the pulse width modulator circuit outputting to the switching means a control signal having a desired duty cycle.

The invention further provides for a method for driving a pulse width modulator circuit comprising the steps of generating a pulse width control signal having a desired duty cycle, defining a first value and a second value corresponding to the desired duty cycle at least approximately and being output during a working cycle for generating the pulse width control signal A-times in total, where A is a predefined integral. The method according to the invention further provides for setting a cycle count Y dictating how often the first and how often the second value is read during the working cycle for setting the desired duty cycle as a function of an average of the first and second value output during the working cycle. More particularly, in accordance with the invention a weighted average is attained by outputting the first value Y-times and the second value (A−Y) times. In the preferred embodiment of the invention the first value further is an integral number X, and the second value is an integral number X+1, whereby the first value may be stored in a storage register whilst the second value is generated by adding 1 to the first value.

Thus, whilst in prior art a pulse width modulator circuit can be set only in integral steps, now in accordance with the invention an adjustment unit setting of the pulse width modulator circuit substantially finer is provided for.

When more particularly A is the number of cycles of the working cycle, Y is the cycle count set in the counter, X is the first value and X+1 is the second value, then the average of the pulse width signal of the pulse width modulator circuit in accordance with the invention can be set in increments of:

$$\frac{[Y*X + (A-Y)*(X+1)]}{A} = X + 1 - \frac{Y}{A}$$

The resolution of the pulse width modulator circuit is e.g. 8+3=11 bits. The invention is implemented more particularly in the form of a computer program as software.

Figure 2:
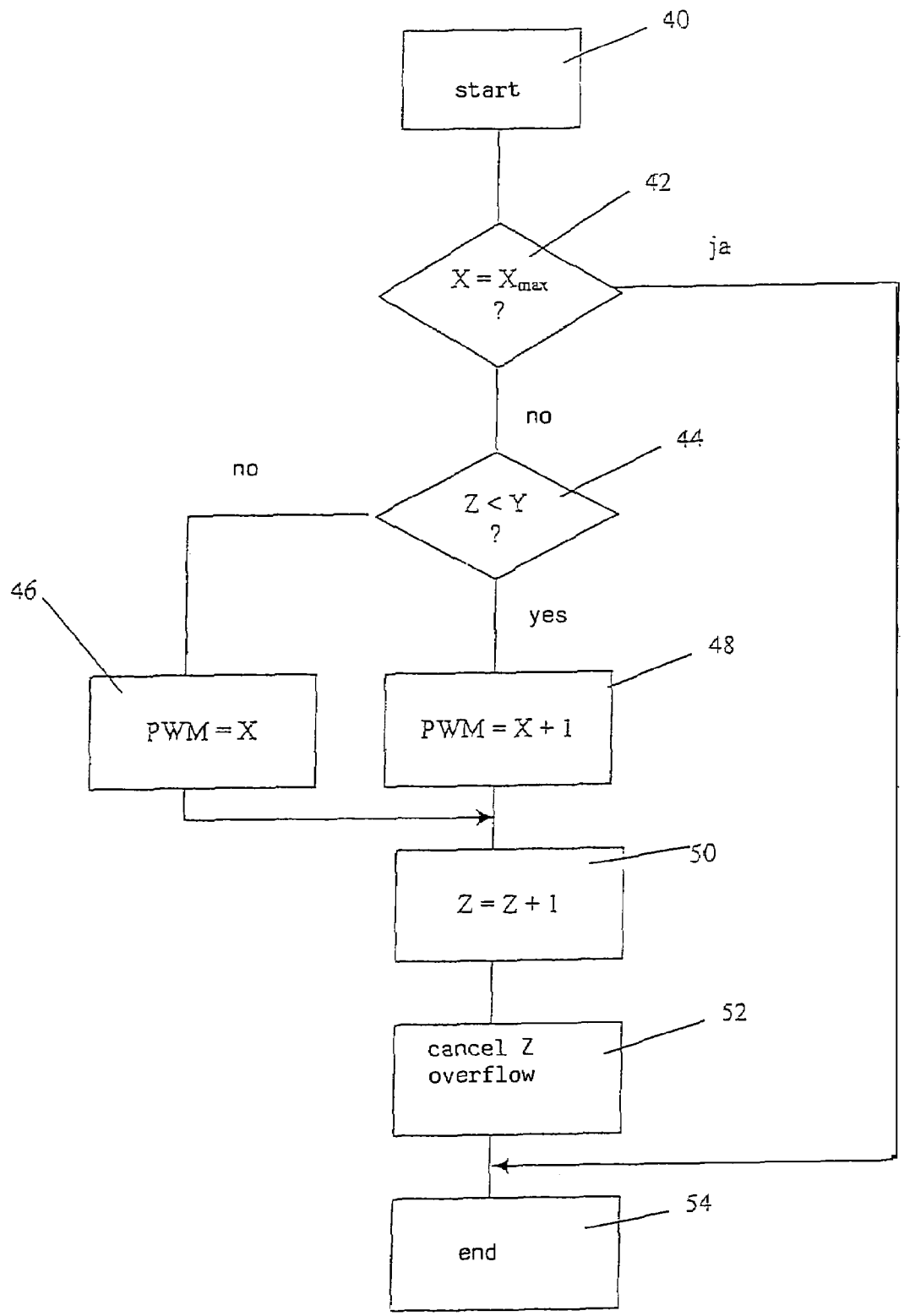

The invention will now be detained by way of preferred embodiments with reference to the drawings in which FIG. 1 is a circuit diagram of a prior art power supply incorporating the pulse width modulator circuit in accordance with the invention and FIG. 2 is a flow chart of the method in accordance with the invention for driving a pulse width modulator circuit.

As already mentioned, it is understood that the power supply shown by way of example in FIG. 1 is merely one of the many possible applications of the pulse width modulator in accordance with the invention.

The method in accordance with the invention for driving a pulse width modulator will now be detained with reference to FIG. 2.

Referring now to FIG. 2 there is illustrated a flow chart of the method in accordance with the invention as implementable in a computer program. In this Fig. the value stored in the storage register is designated X whilst Z identifies the momentary count of the counter and Y the predefined cycle count indicating how often the value X is used during the working cycle. The flow as shown in FIG. 2 is represented as a kind of interrupt subroutine invoked A times during a working cycle.

The method starts with a box 40 termed start as may characterize the start of an interrupt subroutine. In a box 42 a request is firstly represented in which it is established whether the value X stored in the storage register is the maximum possible value. If so, the method is instantly discontinued and the interrupt subroutine is exited at an end box 54. In this case the control or reference signal of the pulse width modulator is simply the maximum possible signal.

If the value X stored in the storage register does not equal the maximum value, e.g. is only 0xFF, the method continues with a further request in box 44 to test whether the count Z has already attained a predefined cycle count Y. If not, the pulse width modulator is driven with the value X stored in the storage register. If yes, the pulse width modulator is driven with the value X+1 stored in the storage register. This is illustrated by the boxes 46 and 48. Assuming that the routine as shown in FIG. 2 is run A times during the working cycle and the value X stored in the storage register does not equal the maximum value, the pulse width modulator is thus driven for the counts of 0 to Y−1 with the value X and for the counts Y to A with the value X+1. The duty cycle of the pulse width modulator thus results from a weighted average of the values X and X+1.

After having determined the driving value for the pulse width modulator in the box 46 or 48 the counter is incremented, as indicated at 50. To cancel any overflow the counter is masked at 52 so that only the relevant bits of the counter, for example the three least significant bits are used further. For this purpose the count can be AND-gated, for example, with b00000111.

Subsequently, the program exits the interrupt subroutine via box 54.

It is understood that achieving the method in accordance with the invention in a computer program merely serves to explain the invention by way of an example. In accordance with the invention it is provided for that the described sequence is repeated A times during the working cycle to set the duty cycle of the pulse width modulator as follows:

$$\frac{[Y*X + (A-Y)*(X+1)]}{A \cdot X_{max}} = \left[X + 1 - \frac{Y}{A}\right] \div X_{max}$$

where $X_{max}$ is the highest number X holdable in the storage register. For a register width of 8 bits $X_{max} = 2^8 = 256$.

The method in accordance with the invention now makes it possible to substantially enhance the resolution of a pulse width modulator without changing the register size. The output signal of the pulse width modulator can be put to use in all applications where a reference signal is needed for setting with high resolution.

It is understood that the features as they read from the above description, in the claims and Figs. may be significant for implementing the invention in the various aspects both individually and in any combination thereof.

List of Reference Numerals
10,12,14,16 rectifier diodes
1. smoothing choke
1. transistor switch
22 output/freewheel diode
24 storage capacitor
26 load resistor
28, 30 voltage divider
32 amplifier, P element
34 pulse width modulator module
36 input amplifier stage
40,42,44,46,48,54 method steps

The invention claimed is:
1. A pulse width modulator circuit for generating a reference signal having a desired duty cycle comprising:
an adjustment unit including at least one storage register and a counter, the storage register being configured for storing values corresponding to the desired duty cycle at least approximately and which are set during a working cycle in the pulse width modulator circuit for generating a reference signal, and the counter setting a cycle count (Y) indicating how often a stored first value (X) is read during the working cycle (A) from the storage register, wherein the first value stored in the storage register is variable upon reaching the cycle count (Y) to store a second value (X+1) which is set for the remainder of the working cycle after the cycle count (Y) is reached; and an adder which receives the stored first value from the storage register and changes it upon reaching the cycle count (Y) to generate a second value (X+1) which is set for the remainder of the working cycle after the cycle count (Y) is reached.

2. The pulse width modulator circuit as set forth in claim 1, wherein the storage register has an 8 bit capacity and the counter a 3 bit capacity.

3. A method for driving a pulse width modulator circuit comprising the steps:

generating a pulse width control signal having a desired duty cycle, defining at least one first value and a second value (46, 48) corresponding at least approximately to the desired duty cycle and being output during a working cycle for generating the pulse width control signal A times in all, where A is a predefined number, and setting (44) a cycle count Y dictating how often the first value and how often the second value is read during the working cycle to set the desired duty cycle as a function of an average of the first and second values output during the working cycle.

4. The method as set forth in claim 3, wherein the first value and the second value are output to a pulse width modulator (34) for generating the pulse width control signal.

5. The method as set forth in claim 3, wherein a first value is output Y times and the second value is output (A-Y) times.

6. The method as set forth in claim 3, wherein the first value is an integer X and the second value is an integer X+1.

7. The method as set forth in claim 6, wherein the first value is stored in a storage register and the second value (X+1) is generated by the addition of 1 to the first value.

8. The method as set forth in claim 3, wherein the cycle count Y is set in a counter, the first value is output (46) during each count clock until the cycle count Y is reached and the second value is output (48) during each count clock after the cycle count is reached up to the end of the working cycle A.

9. The method as set forth in claim 8, wherein the counter is reset at the end of each working cycle (52).

10. A method for driving a power supply wherein a pulse width control signal is generated as set forth in claim 3 and is applied to switching means (20) for generating an output current.

11. A computer program comprising a program code for implementing the method for driving a pulse width modulator circuit comprising the steps:

generating a pulse width control signal having a desired duty cycle, defining at least one first value and a second value (46, 48) corresponding at least approximately to the desired duty cycle and being output during a working cycle for generating the pulse width control signal A times in all, where A is a predetermined number, and setting (44) a cycle count Y dictating how often the first value and how often the second value is read during the working cycle to set the desired cycle as a function of an average of the first and second values output during the working cycle.

12. A power supply comprising:

switching means (20);

a pulse width modulator circuit (34) for generating a reference signal having a desired duty cycle having an adjustment unit including at least one storage register and a counter, the storage register being configured for storing values corresponding to the desired duty cycle at least approximately and which are set during a working cycle in the pulse width modulator circuit for generating a reference signal, and the counter setting a cycle count (Y) indicating how often a stored first value (X) is read during the working cycle (A) from the storage register; and an adder which receives the stored first value from the storage register and changes it upon reaching the cycle count (Y) to generate a second value (X+1) which is set for the remainder of the working cycle after the cycle count (Y) is reached;

wherein the first value stored in the storage register is variable upon reaching the cycle count (Y) to store a second value (X+1) which is set for the remainder of the working cycle after the cycle count (Y) is reached, and wherein the pulse width modulator circuit (34) outputs to the switching means (20) a control signal having a desired duty cycle and corresponding to the reference signal.

13. The power supply of claim 12, wherein the storage register has an 8 bit capacity and the counter a 3 bit capacity.

* * * * *